(12) United States Patent
Strecker et al.

(10) Patent No.: US 10,288,218 B2
(45) Date of Patent: May 14, 2019

(54) SYSTEM, APPARATUS AND METHOD FOR MOUNTING A DEVICE

(71) Applicant: ALSTOM TRANSPORT TECHNOLOGIES, Saint-Ouen (FR)

(72) Inventors: James Strecker, Grain Valley, MO (US); Nick David Nagrodsky, Melbourne, FL (US); William David Shields, Grain Valley, MO (US); Steven Henry, Melbourne, FL (US)

(73) Assignee: Alstom Transport Technologies, Saint-Ouen (FR)

( * ) Notice: Subject to any disclaimer, the term of this patent is extended or adjusted under 35 U.S.C. 154(b) by 296 days.

(21) Appl. No.: 15/153,034

(22) Filed: May 12, 2016

(65) Prior Publication Data

US 2016/0334055 A1    Nov. 17, 2016

Related U.S. Application Data

(60) Provisional application No. 62/161,583, filed on May 14, 2015.

(51) Int. Cl.
| | |
|---|---|
| *F16M 13/02* | (2006.01) |
| *B61L 1/00* | (2006.01) |
| *H05K 5/02* | (2006.01) |
| *B61L 29/08* | (2006.01) |
| *B61L 3/02* | (2006.01) |
| *B61L 5/18* | (2006.01) |
| *B61L 29/24* | (2006.01) |

(52) U.S. Cl.
CPC .............. *F16M 13/02* (2013.01); *B61L 1/00* (2013.01); *H05K 5/0204* (2013.01); *A47B 2230/07* (2013.01); *B61L 3/02* (2013.01); *B61L 5/18* (2013.01); *B61L 29/08* (2013.01); *B61L 29/24* (2013.01); *F16M 2200/02* (2013.01)

(58) Field of Classification Search
CPC .......... F16M 13/02; F16M 11/00; B61L 1/00; B61L 3/02; B61L 5/18; B61L 29/08; B61L 29/24; H05K 5/0204; A47B 2230/07
See application file for complete search history.

(56) References Cited

U.S. PATENT DOCUMENTS

| | | | | |
|---|---|---|---|---|
| 4,048,768 | A * | 9/1977 | Good | A47B 57/40 248/220.43 |
| 4,800,387 | A | 1/1989 | Joy | |
| 5,326,206 | A | 7/1994 | Moore | |
| 6,123,314 | A * | 9/2000 | Steele | F16B 5/0642 248/222.11 |
| 7,175,152 | B2 * | 2/2007 | Dittmer | F16M 11/041 248/221.11 |

(Continued)

*Primary Examiner* — Anita M King
(74) *Attorney, Agent, or Firm* — Knobbe, Martens, Olson & Bear, LLP

(57) ABSTRACT

A mounting apparatus includes a back plate, at least one lower receiving channel adjacent to a lower edge of the back plate and configured to receive a lower holding tab of a line-replaceable unit, at least one upper receiving channel adjacent to an upper edge of the back plate and configured to receive an upper holding tab of the line-replaceable unit, and at least one tensioning member configured to urge the lower holding tab and the upper holding tab into the at least one lower receiving channel and the at least one upper receiving channel, respectively.

13 Claims, 5 Drawing Sheets

(56) References Cited

U.S. PATENT DOCUMENTS

| | | | |
|---|---|---|---|
| 7,261,264 B2 * | 8/2007 | Moran | A01K 1/0356 |
| | | | 24/573.11 |
| 7,508,338 B2 | 3/2009 | Pluymers et al. | |
| 8,053,683 B2 | 11/2011 | Slocum et al. | |
| 8,240,648 B1 | 8/2012 | Pluymers et al. | |
| 8,526,881 B2 | 9/2013 | Lee et al. | |
| 8,810,448 B1 | 8/2014 | Ellsworth et al. | |
| 8,854,818 B1 | 10/2014 | Angelucci | |
| 2010/0101068 A1 | 4/2010 | Kipp et al. | |
| 2010/0277875 A1 * | 11/2010 | Moorehead, Jr. | H05K 7/1412 |
| | | | 361/747 |

* cited by examiner

SYSTEM, APPARATUS AND METHOD FOR MOUNTING A DEVICE

FIELD OF THE INVENTION

Embodiments of the invention relate generally to signal appliances. Other embodiments relate to mounting railroad signal appliances.

BACKGROUND OF THE INVENTION

Signal control electronics are utilized in the rail industry to detect the presence of trains at various locations along a track, such as at railroad grade crossings. In particular, such signal control electronics are utilized to detect when a train approaches and exits a grade crossing and to control various grade crossing warning and signaling devices including gates, lights and sounds. Typically, such signal control electronics have been arranged in a card file system, where a chassis or card file is populated with a plurality of modules configured to accomplish a specific signal related task, such as crossing control. In the event of a specific failure, a technician must troubleshoot to the specific module at issue, replace it, and place the unit back into service. Due to the size, complexity and cost of such systems, however, they have slowly fallen out of favor.

Single line-replaceable units, known as LRUs, have slowly taken the place of card file systems. Typically, each LRU is mounted within a housing adjacent to the track at a grade crossing using DIN rail, wood screws and/or other fasteners. In particular, the LRUs are often screwed to a wall or rack system within the housing and must undergo shake and/or vibration testing to meet industry stability standards. With LRUs, if a single LRU fails, a technician replaces or swaps out the entire unit. Such systems, however, require the use of tools when mounting or replacing any LRU, which results in added complexity and increased servicing or replacement time.

It may be desirable to provide a system and method for mounting railroad signal appliances that differ from existing systems and methods.

BRIEF DESCRIPTION OF THE INVENTION

In an embodiment, an apparatus includes a back plate, at least one lower receiving channel adjacent to a lower edge of the back plate and configured to receive a lower holding tab of a device (e.g., line-replaceable unit, or other electronic device, or other device more generally), at least one upper receiving channel adjacent to an upper edge of the back plate and configured to receive an upper holding tab of the device, and at least one tensioning member configured to urge the lower holding tab and the upper holding tab into the at least one lower receiving channel and the at least one upper receiving channel, respectively.

In an embodiment, a system includes a device and a mounting apparatus. The device (e.g., a line-replaceable unit or other electronic device, or other device more generally, such as a mechanical device) has a housing with a lower holding tab and an upper holding tab. The lower holding tab is disposed on a lower rear side of the housing and the upper holding tab is disposed on an upper rear side of the housing. The mounting apparatus includes a back plate, at least one lower receiving channel adjacent to a lower edge of the back plate and configured to receive the lower holding tab of the housing, at least one upper receiving channel adjacent to an upper edge of the back plate and configured to receive the upper holding tab of the housing, and at least one tensioning member configured to urge the lower holding tab and the upper holding tab into the at least one lower receiving channel and the at least one upper receiving channel, respectively.

Yet another embodiment of the invention relates to a method of mounting a line-replaceable unit or other device. The method includes the steps of aligning the line-replaceable unit or other device with a mounting plate, positioning at least one upper holding tab of the line-replaceable unit or other device in an upper receiving channel of the mounting plate, engaging a tensioning member with the upper holding tab, and actuating the tensioning member to exert a generally downward force on the upper holding tab.

BRIEF DESCRIPTION OF THE DRAWINGS

The present invention will be better understood from reading the following description of non-limiting embodiments, with reference to the attached drawings, wherein below.

DETAILED DESCRIPTION OF THE INVENTION

Figure 1:
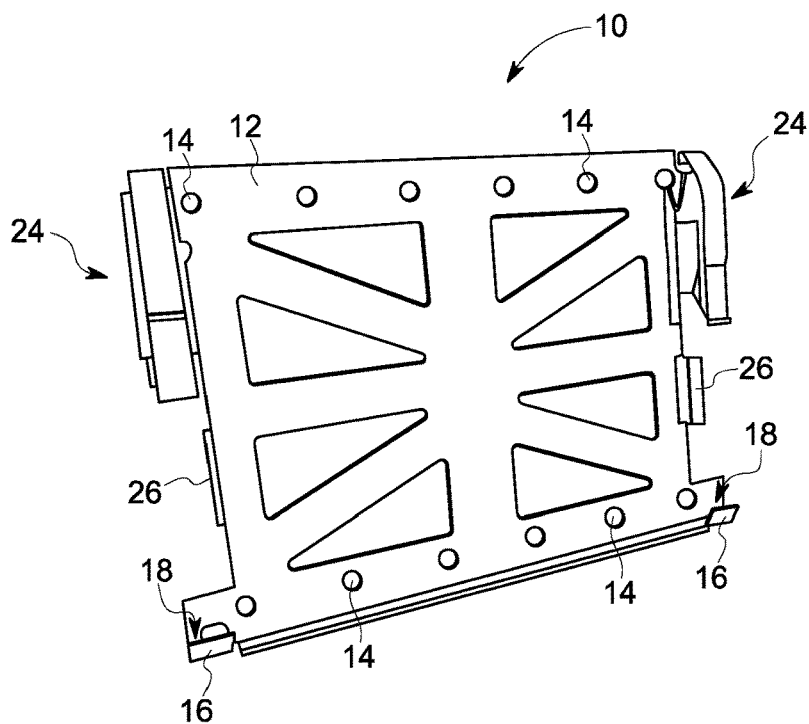
FIG. 1 is a perspective view of a mounting apparatus, according to an embodiment of the present invention.

Reference will be made below in detail to exemplary embodiments of the invention, examples of which are illustrated in the accompanying drawings. Wherever possible, the same reference numerals used throughout the drawings refer to the same or like parts. For clarity of purpose, exemplary embodiments of the invention are described with respect to mounting railroad signal appliances. Embodiments of the invention, however, may also be applicable to the mounting of electronic devices, generally, including any electronic device configured to perform any desired function, within any industry.

For example, certain embodiments may be used with equipment along a roadway or other surface or structure configured for automobile travel. Such equipment could include signaling equipment, charging equipment, or, in the case of self-guided or automated vehicles, guidance equipment. In addition, in certain embodiments, the invention may further be utilized to assist in the mounting of purely or partially mechanical components/devices, in addition to electronic devices.

As used herein, "selectively movable" means that a component may be moved from one position in one mode of operation to another position in another mode of operation.

With reference to FIG. 1, a mounting apparatus 10 for a railroad signal appliance (or other device) according to an embodiment of the invention is illustrated. The mounting apparatus 10 is generally rectangular in shape and includes a substantially planar back plate 12. The back plate 12 may be a generally solid body or may have a plurality of cutouts or relieved portions formed therein, as illustrated in FIG. 1. The back plate 12 may also include a plurality of apertures 14 that allow the mounting apparatus 10 to be secured to a mounting surface, such as an interior of a cabinet or housing, utilizing screws or other suitable fasteners. The two lower corners of the mounting apparatus 10 are formed with angled lower receiving tabs 16 defining a generally upwards-facing U-shaped or V-shaped channel 18, the purpose of which will be hereinafter described. Likewise, the two upper corners of the mounting apparatus 10 are formed with upper receiving tabs 20 defining an upper channel 22, the purpose of which will also be hereinafter described. As further illustrated in FIG. 1, the mounting apparatus 10 also includes a pair of opposed tensioning members 24.

Figure 2:
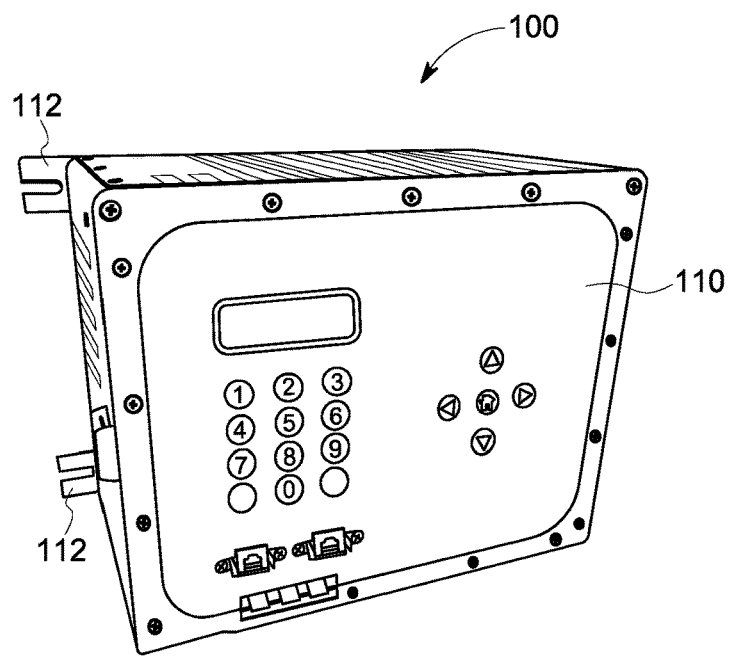
FIG. 2 is a perspective view of a railroad signal appliance for mounting utilizing the mounting apparatus of FIG. 1.
Figure 3:
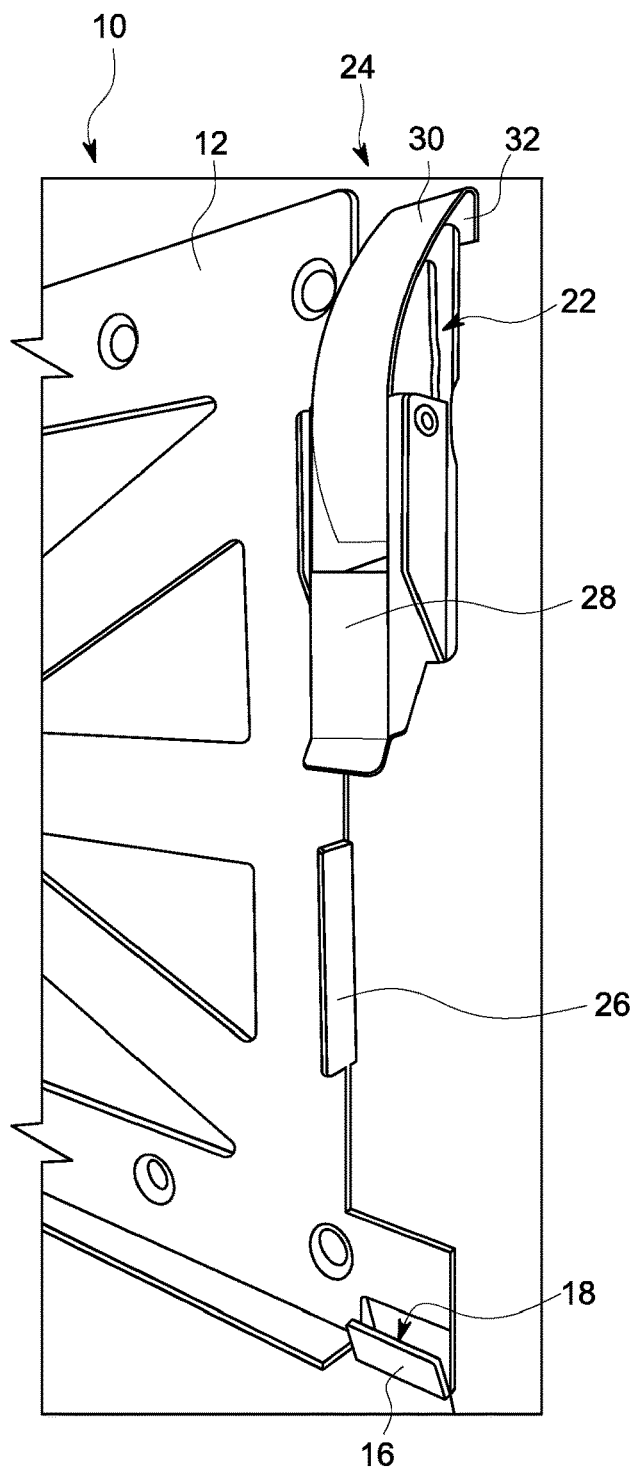
FIG. 3 is a detail, perspective view of the mounting apparatus of FIG. 1, illustrating a tensioning member and receiving tab thereof.
Figure 4:
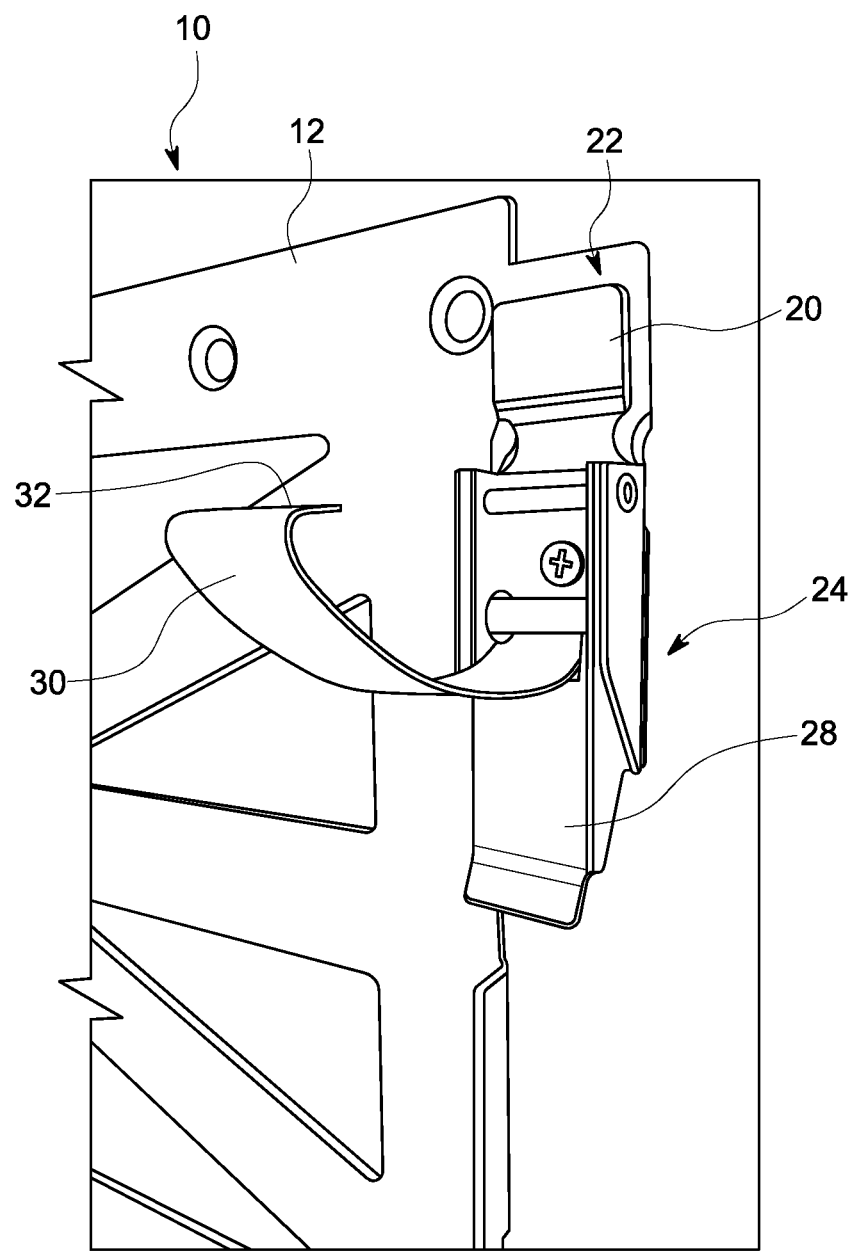
FIG. 4 is a detail, perspective view of the mounting apparatus of FIG. 1, illustrating the tensioning member in a fully open state.

With reference to FIG. 2, a railroad signal appliance 100 (or other device) configured for mounting utilizing the mounting apparatus 10 is illustrated. The signal appliance 100 includes a generally rectangular, sealed housing 110 enclosing electronic and/or mechanical components (not shown). In an embodiment, the signal appliance 100 is configured to detect the presence and absence of a train at a grade crossing, as well as to control various grade crossing warning and signaling devices including gates, lights and sounds. In an embodiment, the signal appliance 100 is constructed as a single line-replaceable unit that is designed to be replaced quickly at an operating location, such as at a grade crossing. As illustrated in FIG. 2, the signal appliance 100 includes four holding tabs 112 protruding from the rear four corners of the housing 112. The holding tabs 112 are substantially coplanar with a back plate (not shown) of the housing 112 and may be generally U-shaped.

Referring back to FIG. 1, the width and height of the back plate 12 may generally correspond to the width and height of the housing 110 of the signal appliance 100. In connection with this, in an embodiment, the mounting apparatus 10 may also include a pair of opposed side stops 26 configured to receive the signal appliance therebetween.

As shown in FIGS. 3-6, the tensioning members 24 include a latch 28 pivotally connected to the back plate 12 at one end thereof, and a tensioning spring clamp 30 pivotally connected to the latch 28 at an approximate midpoint along the length of the latch 28. The tensioning spring clamp 30 is arcuate in shape and has an angled retaining leg 32 depending from a distal end thereof. In an embodiment, all the components of the mounting apparatus 10 are formed from metal. In other embodiments, the mounting apparatus 10 or components thereof may be formed from plastic.

As indicated above, the mounting apparatus 10 is configured to be at least semi-permanently mounted to the inside of a cabinet or housing at a desired location, such as at a grade crossing, utilizing screws of the like. In operation, when mounting a signal appliance 100, a technician or user first pulls up on the latch 28 to move the tensioning member from its closed, tensioned state (shown in FIG. 3), to its open, relaxed state (shown in FIG. 4) to allow access to the upper receiving channels 22. The technician or user then places the signal appliance 100 against the back plate 12 of the mounting apparatus 10 between the side stops 26 such that the upper holding tabs 112 of the signal appliance 100 are positioned generally above the upper receiving channels 22 and the lower holding tabs 112 of the signal appliance 100 are generally above the lower receiving channels 18. The signal appliance 100 is then lowered until the lower holding tabs 112 are received in the lower receiving channels 18 of the mounting apparatus 10 and the upper holding tabs 112 are receiving in the upper receiving channels 22 of the mounting apparatus. At this point, the signal appliance 100 is held in place and the technician may release the appliance 100 for final securement.

Figure 5:
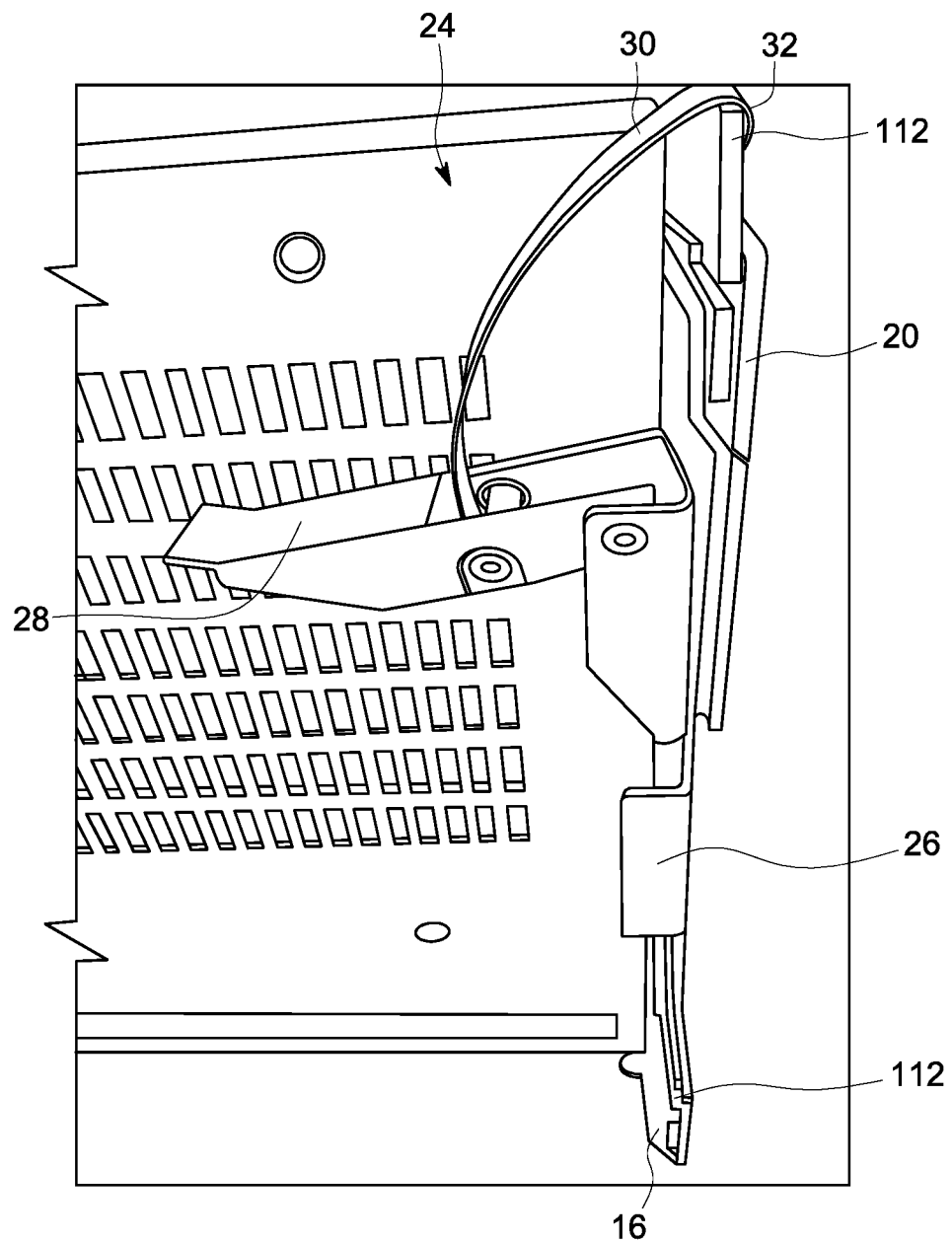
FIG. 5 is a detail, perspective view of the mounting apparatus of FIG. 1, illustrating the tensioning member in a partially closed state.
Figure 6:
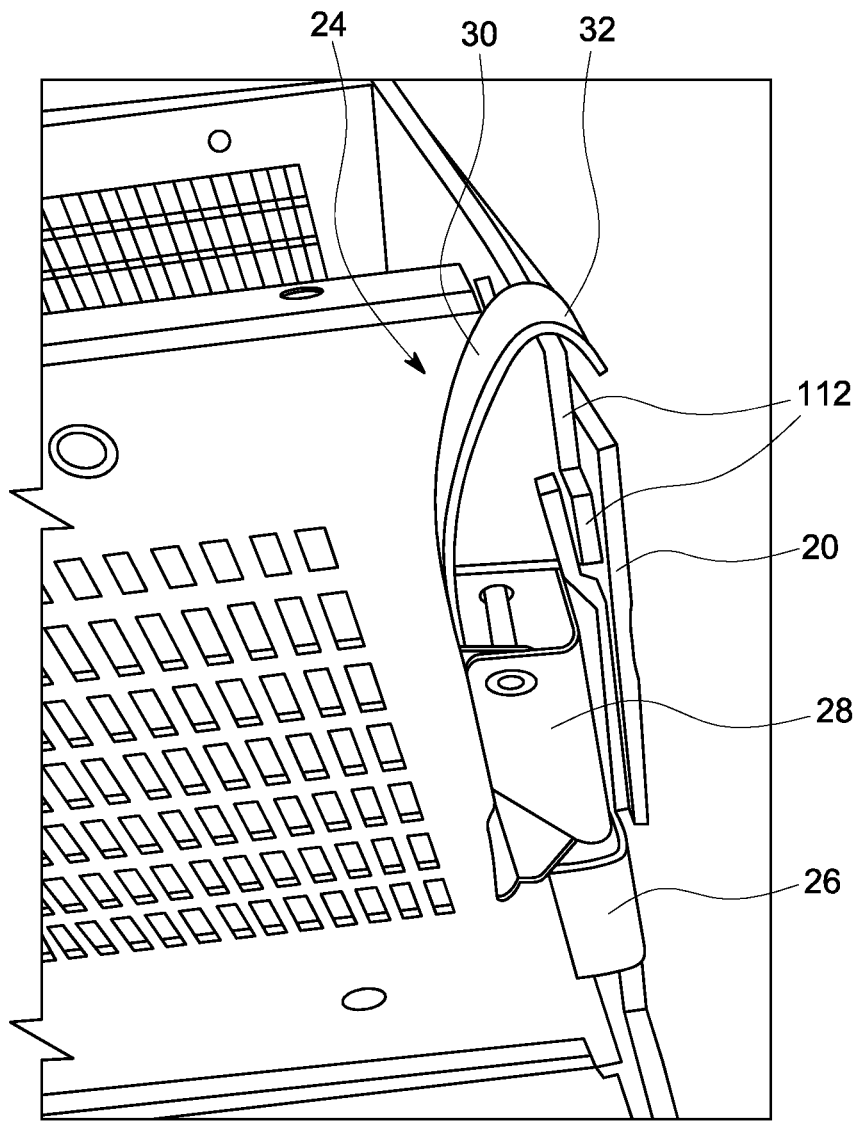
FIG. 6 is a detail, perspective view of the mounting apparatus of FIG. 1, illustrating the tensioning member in a fully closed and tensioned state.

As shown in FIG. 5, once the appliance 100 is positioned in place, the latch 28 is lifted upward and the tensioning spring clamp 30 is rotated towards the back plate 12 until the angled retaining leg 32 of the spring clamp 30 is positioned over the upper holding tab 112 of the appliance 100. The latch 28 may then be pushed downward to its closed position, as illustrated in FIG. 6. As the latch 28 is pushed downwards to its ultimate closed state the spring clamp 30 applies a downward, tensioning force to the upper holding tabs 112, effectively urging the upper and lower tabs 112 into fully-seated engagement within the upper and lower channels 22, 18, respectively. The tensioning force exerted by the tensioning members 24 serves to effectively hold the appliance 100 in seated position within the mounting apparatus 10 and provides for stability, even under shaking and vibration generated by passing trains.

When replacement of the signal appliance 100 is necessary or desired, a technician may simply lift up on the latches 28, thereby relieving the tension on the upper holding tabs 112 of the signal appliance 100. The appliance 100 may then be lifted out from engagement with the mounting apparatus 10 and a new appliance 100 installed in the manner hereinbefore described.

The mounting apparatus 10 of the present invention therefore allows for the quick installment and replacement of line-replaceable units, namely, railroad signal appliances, without the use of tools. Moreover, the engagement of the holding tabs 112 within the channels 18, 22 of the mounting apparatus 10 allows a technician to place the appliance into position and let go, relieving the technician to manipulate the tensioning members 24 to securely lock the appliance in place. As a result, service time and complexity may be significantly reduced as compared to existing mounting systems and methods.

In an embodiment, an apparatus includes a back plate, at least one lower receiving channel adjacent to a lower edge of the back plate and configured to receive a lower holding tab of a line-replaceable unit, at least one upper receiving channel adjacent to an upper edge of the back plate and configured to receive an upper holding tab of the line-replaceable unit, and at least one tensioning member configured to urge the lower holding tab and the upper holding tab into the at least one lower receiving channel and the at least one upper receiving channel, respectively.

In an embodiment, a mounting apparatus includes a back plate (e.g., configured for attachment to a vertical wall surface), at least one lower receiving channel adjacent to a lower edge of the back plate and configured to receive a lower holding tab of a housing of a device, at least one upper receiving channel adjacent to an upper edge of the back plate and configured to receive an upper holding tab of the housing, and at least one tensioning member configured to urge the lower holding tab and the upper holding tab into the at least one lower receiving channel and the at least one upper receiving channel, respectively.

In an embodiment, a mounting apparatus includes a back plate, at least one lower receiving channel adjacent to a lower edge of the back plate and configured to receive a lower holding tab of a housing of a device, at least one upper receiving channel adjacent to an upper edge of the back plate and configured to receive an upper holding tab of the housing, and at least one tensioning member configured to urge the lower holding tab and the upper holding tab into the at least one lower receiving channel and the at least one upper receiving channel, respectively. The at least one tensioning member includes a latch pivotally connected to the back plate and a spring clamp pivotally connected to the latch. Additionally, the spring clamp may include a distal end having an angled retaining member.

In an embodiment, a mounting apparatus includes a back plate, at least one lower receiving channel adjacent to a lower edge of the back plate and configured to receive a lower holding tab of a housing of a device, at least one upper receiving channel adjacent to an upper edge of the back plate and configured to receive an upper holding tab of the housing, and at least one tensioning member configured to urge the lower holding tab and the upper holding tab into the at least one lower receiving channel and the at least one upper receiving channel, respectively. The tensioning member is selectively movable between a first position and a second position. In the first position the tensioning member urges the lower holding tab and the upper holding tab into the at least one lower receiving channel and the at least one upper receiving channel, respectively. In the second position the tensioning member is disengaged from the upper holding tab.

In an embodiment, a mounting apparatus includes a back plate, at least one lower receiving channel adjacent to a lower edge of the back plate and configured to receive a lower holding tab of a housing of a line-replaceable unit, at least one upper receiving channel adjacent to an upper edge of the back plate and configured to receive an upper holding tab of the housing, and at least one tensioning member configured to urge the lower holding tab and the upper holding tab into the at least one lower receiving channel and the at least one upper receiving channel, respectively.

In an embodiment, a mounting apparatus includes a back plate, at least one lower receiving channel adjacent to a lower edge of the back plate and configured to receive a lower holding tab of a housing of a railroad signal appliance, at least one upper receiving channel adjacent to an upper edge of the back plate and configured to receive an upper holding tab of the housing, and at least one tensioning member configured to urge the lower holding tab and the upper holding tab into the at least one lower receiving channel and the at least one upper receiving channel, respectively.

In another embodiment, a system includes a back plate, at least one lower receiving channel adjacent to a lower edge of the back plate and configured to receive a lower holding tab of a line-replaceable unit, at least one upper receiving channel adjacent to an upper edge of the back plate and configured to receive an upper holding tab of the line-replaceable unit, and at least one tensioning member configured to urge the lower holding tab and the upper holding tab into the at least one lower receiving channel and the at least one upper receiving channel, respectively.

In an embodiment, a system includes a device and a mounting apparatus. The device has a housing with a lower holding tab and an upper holding tab. The lower holding tab is disposed on a lower rear side of the housing and the upper holding tab is disposed on an upper rear side of the housing. The mounting apparatus includes a back plate (e.g., configured for attachment to a vertical wall surface), at least one lower receiving channel adjacent to a lower edge of the back plate and configured to receive the lower holding tab of the housing, at least one upper receiving channel adjacent to an upper edge of the back plate and configured to receive the upper holding tab of the housing, and at least one tensioning member configured to urge the lower holding tab and the upper holding tab into the at least one lower receiving channel and the at least one upper receiving channel, respectively.

In an embodiment, a system includes a device and a mounting apparatus. The device has a housing with a lower holding tab and an upper holding tab. The lower holding tab is disposed on a lower rear side of the housing and the upper holding tab is disposed on an upper rear side of the housing. The mounting apparatus includes a back plate, at least one lower receiving channel adjacent to a lower edge of the back plate and configured to receive the lower holding tab of the housing, at least one upper receiving channel adjacent to an upper edge of the back plate and configured to receive the upper holding tab of the housing, and at least one tensioning member configured to urge the lower holding tab and the upper holding tab into the at least one lower receiving channel and the at least one upper receiving channel, respectively. The at least one tensioning member includes a latch pivotally connected to the back plate and a spring clamp pivotally connected to the latch. Additionally, the spring clamp may include a distal end having an angled retaining member.

In an embodiment, a system includes a device and a mounting apparatus. The device has a housing with a lower holding tab and an upper holding tab. The lower holding tab is disposed on a lower rear side of the housing and the upper holding tab is disposed on an upper rear side of the housing. The mounting apparatus includes a back plate, at least one lower receiving channel adjacent to a lower edge of the back plate and configured to receive the lower holding tab of the housing, at least one upper receiving channel adjacent to an upper edge of the back plate and configured to receive the upper holding tab of the housing, and at least one tensioning member configured to urge the lower holding tab and the upper holding tab into the at least one lower receiving channel and the at least one upper receiving channel, respectively. The tensioning member is selectively movable between a first position and a second position. In the first position the tensioning member urges the lower holding tab and the upper holding tab into the at least one lower receiving channel and the at least one upper receiving channel, respectively. In the second position the tensioning member is disengaged from the upper holding tab.

In an embodiment, a system includes a line-replaceable unit and a mounting apparatus. The line-replaceable unit has a housing with a lower holding tab and an upper holding tab. The lower holding tab is disposed on a lower rear side of the housing and the upper holding tab is disposed on an upper rear side of the housing. The mounting apparatus includes a back plate, at least one lower receiving channel adjacent to a lower edge of the back plate and configured to receive the lower holding tab of the housing, at least one upper receiving channel adjacent to an upper edge of the back plate and configured to receive the upper holding tab of the housing, and at least one tensioning member configured to urge the lower holding tab and the upper holding tab into the at least one lower receiving channel and the at least one upper receiving channel, respectively.

In an embodiment, a system includes a railroad signal appliance and a mounting apparatus. The railroad signal appliance has a housing with a lower holding tab and an upper holding tab. The lower holding tab is disposed on a lower rear side of the housing and the upper holding tab is disposed on an upper rear side of the housing. The mounting apparatus includes a back plate, at least one lower receiving channel adjacent to a lower edge of the back plate and configured to receive the lower holding tab of the housing, at least one upper receiving channel adjacent to an upper edge of the back plate and configured to receive the upper holding tab of the housing, and at least one tensioning member configured to urge the lower holding tab and the upper holding tab into the at least one lower receiving channel and the at least one upper receiving channel, respectively.

In an embodiment, a system includes a railroad signal appliance and a mounting apparatus. The railroad signal appliance has a housing with a lower holding tab and an upper holding tab, the lower holding tab disposed on a lower rear side of the housing and the upper holding tab disposed on an upper rear side of the housing. The mounting apparatus includes a back plate configured for attachment to a vertical wall surface, at least one lower receiving channel adjacent to a lower edge of the back plate and configured to receive the lower holding tab of the housing, at least one upper receiving channel adjacent to an upper edge of the back plate and configured to receive the upper holding tab of the housing, and at least one tensioning member configured to urge the lower holding tab and the upper holding tab into the at least one lower receiving channel and the at least one upper receiving channel, respectively. When the back plate is attached to the vertical wall surface and the lower holding tab and the upper holding tab are received in the at least one lower receiving channel and the at least one upper receiving channel, respectively, the railroad signal appliance is held by the mounting apparatus against the vertical wall surface.

In yet another embodiment, a method of mounting a line-replaceable unit includes the steps of aligning the line-replaceable unit with a mounting plate, positioning at least one upper holding tab of the line-replaceable unit in an upper receiving channel of the mounting plate, engaging a tensioning member with the upper holding tab, and actuating the tensioning member to exert a generally downward force on the upper holding tab.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The terms "including" and "in which" are used as the plain-English equivalents of the respective terms "comprising" and "wherein." Moreover, the terms "first," "second," "third," "upper," "lower," "bottom," "top," etc. are used merely as labels, and are not intended to impose numerical or positional requirements on their objects.

This written description uses examples to disclose several embodiments of the invention, including the best mode, and also to enable one of ordinary skill in the art to practice the embodiments of invention, including making and using any devices or systems and performing any incorporated methods.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the embodiments described herein, it is intended that all of the subject matter of the above description or shown in the accompanying drawings shall be interpreted merely as examples illustrating the inventive concept herein and shall not be construed as limiting the invention.

What is claimed is:

1. A mounting apparatus comprising:
   a back plate;
   at least one lower receiving channel adjacent to a lower edge of the back plate and configured to receive a lower holding tab of a housing of a device;
   at least one upper receiving channel adjacent to an upper edge of the back plate and configured to receive an upper holding tab of the housing; and
   at least one tensioning member configured to urge the lower holding tab and the upper holding tab into the at least one lower receiving channel and the at least one upper receiving channel, respectively,
   wherein the at least one tensioning member includes a latch pivotally connected to the back plate and a spring clamp pivotally connected to the latch.

2. The mounting apparatus of claim 1, wherein:
   the spring clamp includes a distal end having an angled retaining member.

3. The mounting apparatus of claim 1, wherein:
   the tensioning member is selectively movable between a first position and a second position;
   wherein in the first position the tensioning member urges the lower holding tab and the upper holding tab into the at least one lower receiving channel and the at least one upper receiving channel, respectively; and
   wherein in the second position the tensioning member is disengaged from the upper holding tab.

4. The mounting apparatus of claim 1, wherein the back plate is configured for attachment to a vertical wall surface.

5. A system comprising:
   a device having a housing with a lower holding tab and an upper holding tab, the lower holding tab disposed on a lower rear side of the housing and the upper holding tab disposed on an upper rear side of the housing; and
   a mounting apparatus according to claim 1.

6. The system of claim 5, wherein:
   the at least one tensioning member includes a latch pivotally connected to the back plate and a spring clamp pivotally connected to the latch.

7. The system of claim 6, wherein:
   the spring clamp includes a distal end having an angled retaining member.

8. The system of claim 5, wherein:
   the tensioning member is selectively movable between a first position and a second position;
   wherein in the first position the tensioning member urges the lower holding tab and the upper holding tab into the at least one lower receiving channel and the at least one upper receiving channel, respectively; and
   wherein in the second position the tensioning member is disengaged from the upper holding tab.

9. The system of claim 5, wherein the device is a line-replaceable unit.

10. The system of claim 9, wherein the line-replaceable unit is a railroad signal appliance.

11. The system of claim 5, wherein the back plate is configured for attachment to a vertical wall surface.

12. A system comprising:
- a railroad signal appliance having a housing with a lower holding tab and an upper holding tab, the lower holding tab disposed on a lower rear side of the housing and the upper holding tab disposed on an upper rear side of the housing; and
- a mounting apparatus comprising:
  - a back plate configured for attachment to a vertical wall surface;
  - at least one lower receiving channel adjacent to a lower edge of the back plate and configured to receive the lower holding tab of the housing;
  - at least one upper receiving channel adjacent to an upper edge of the back plate and configured to receive the upper holding tab of the housing; and
  - at least one tensioning member configured to urge the lower holding tab and the upper holding tab into the at least one lower receiving channel and the at least one upper receiving channel, respectively;
  - wherein when the back plate is attached to the vertical wall surface and the lower holding tab and the upper holding tab are received in the at least one lower receiving channel and the at least one upper receiving channel, respectively, the railroad signal appliance is held by the mounting apparatus against the vertical wall surface.

13. A method for mounting a line-replaceable unit or other device, comprising the steps of:
- aligning the line-replaceable unit or other device with a mounting plate;
- positioning at least one upper holding tab of the line-replaceable unit or other device in an upper receiving channel of the mounting plate;
- engaging a tensioning member with the upper holding tab; and
- actuating the tensioning member to exert a generally downward force on the upper holding tab.

* * * * *